(12) United States Patent
Lin et al.

(10) Patent No.: US 11,037,803 B2
(45) Date of Patent: Jun. 15, 2021

(54) METHOD FOR MAKING REDISTRIBUTION CIRCUIT STRUCTURE

(71) Applicant: Century Technology (Shenzhen) Corporation Limited, Shenzhen (CN)

(72) Inventors: Yung-Fu Lin, New Taipei (TW); Po-Liang Chen, New Taipei (TW)

(73) Assignee: Century Technology (Shenzhen) Corporation Limited, Shenzhen (CN)

(*) Notice: Subject to any disclaimer, the term of this patent is extended or adjusted under 35 U.S.C. 154(b) by 0 days.

(21) Appl. No.: 16/850,216

(22) Filed: Apr. 16, 2020

(65) Prior Publication Data
US 2020/0343104 A1 Oct. 29, 2020

(30) Foreign Application Priority Data
Apr. 29, 2019 (CN) .......................... 201910353582.4

(51) Int. Cl.
| | |
|---|---|
| H05K 3/02 | (2006.01) |
| H05K 3/10 | (2006.01) |
| H01L 21/48 | (2006.01) |
| H01L 21/027 | (2006.01) |
| H01L 21/683 | (2006.01) |
| H01L 23/498 | (2006.01) |
| H01L 23/00 | (2006.01) |

(52) U.S. Cl.
CPC ........ *H01L 21/486* (2013.01); *H01L 21/0273* (2013.01); *H01L 21/6835* (2013.01); *H01L 23/4985* (2013.01); *H01L 24/19* (2013.01); *H01L 24/93* (2013.01); *H01L 2221/68345* (2013.01); *H01L 2221/68359* (2013.01)

(58) Field of Classification Search
CPC ... H01L 21/486; H01L 21/6835; H01L 24/19; H01L 24/93; H01L 2221/68345; H01L 2221/68359; H01L 21/4846; H01L 21/0273; H01L 23/4985; Y10T 29/49155; Y10T 29/49165; H05K 3/205
USPC ................................................... 29/846, 852
See application file for complete search history.

(56) References Cited

U.S. PATENT DOCUMENTS

| | | | | |
|---|---|---|---|---|
| 5,568,682 A * | 10/1996 | Gates, Jr. | ............ | H01L 23/5386 29/852 |
| 6,890,413 B2 * | 5/2005 | Cheng | ...................... | C25D 5/02 205/118 |
| 7,065,869 B2 * | 6/2006 | Kang | .................. | H01L 21/4846 29/846 |
| 7,346,982 B2 * | 3/2008 | Kim | ...................... | H05K 3/205 29/852 |

* cited by examiner

*Primary Examiner* — Donghai D Nguyen
(74) *Attorney, Agent, or Firm* — ScienBiziP, P.C.

(57) ABSTRACT

A method for making a redistribution circuit structure provides a substrate and forms a peelable layer on the substrate. A metal layer is formed on a surface of the peelable layer, the metal layer including a controlling circuit including at least two spaced units. A first photoresist layer is formed on a portion of the surface of the peelable layer and an insulating layer is applied to completely cover the first photoresist layer and the controlling circuit. Through holes are defined in the insulating layer to partially expose the controlling circuit and a seed layer applied on the insulating layer. A block layer is laid to divide the seed layer into multiple sections and electroplating in each section on a portion of the seed layer is applied to form a plating layer with better uniformity of thickness across all sections.

11 Claims, 7 Drawing Sheets

METHOD FOR MAKING REDISTRIBUTION CIRCUIT STRUCTURE

FIELD

The subject matter herein generally relates to a field of semiconductor packaging, particular relates to a method for making a redistribution circuit structure.

BACKGROUND

Integration of various electronic components (such as transistors, diodes, resistors, capacitors, etc.) is increasing in the semiconductor industry. Nowadays, fan-out panel level packaging has become popular. The formation of redistribution layer structures plays an important role in the fan-out panel-level packaging. A conventional method for making a redistribution circuit is obtained by electroplating on a substrate.

BRIEF DESCRIPTION OF THE DRAWINGS

Implementations of the present technology will now be described, by way of embodiments only, with reference to the attached figures.

DETAILED DESCRIPTION

Figure 1:
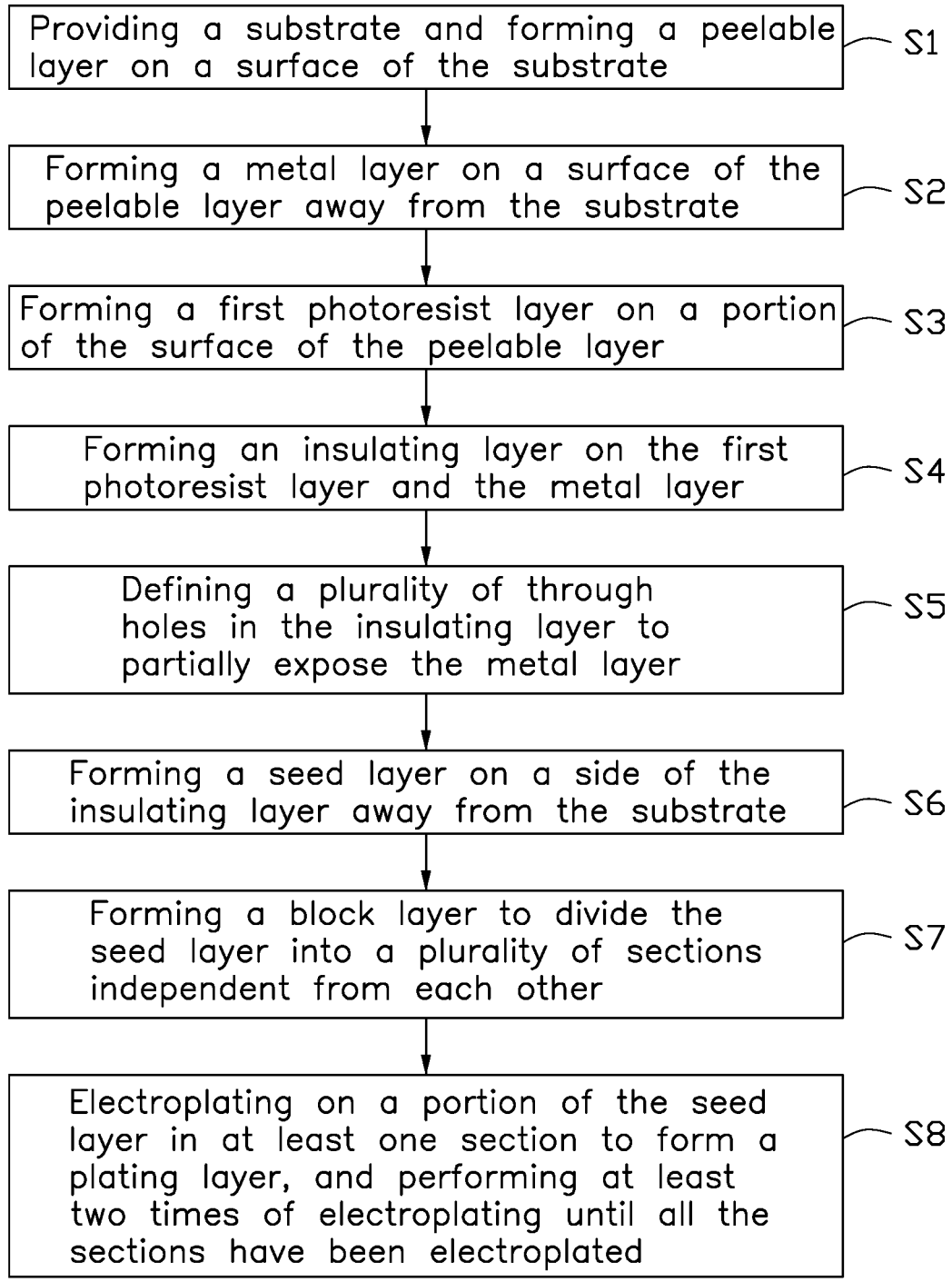
FIG. 1 is view showing a flow chart of a method for making a redistribution circuit structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The redistribution circuit structure is a component in a semiconductor packaging, and can be used in a semiconductor packaging (especially a fan-out panel-level packaging) to electrically connect a chip to a circuit board. FIG. 1 is a flowchart of a method for making a redistribution circuit structure according to an embodiment of the present disclosure. FIG. 2 through FIG. 11 are cross-sectional views showing each step of method for making the redistribution circuit structure.

Referring to FIG. 1, a method for making a redistribution circuit structure includes the following steps.

Step S1: a substrate is provided and a peelable layer is formed on a surface of the substrate.

Step S2: a metal layer is formed on a surface of the peelable layer away from the substrate.

Step S3: a first photoresist layer is formed on the surface of the peelable layer on which the metal layer is formed.

Step S4: an insulating layer is formed on the metal layer and the first photoresist layer.

Step S5: a plurality of through holes is defined in the insulating layer to partially expose the metal layer.

Step S6: a conductive seed layer is formed on a side of the insulating layer away from the substrate.

Step S7: a block layer is formed to divide the seed layer into a plurality of independent sections.

Step S8: at least one section is selected to be electroplated to form a plating layer on the seed layer each time, and electroplating is performed at least twice until all sections have been electroplated.

Figure 2:
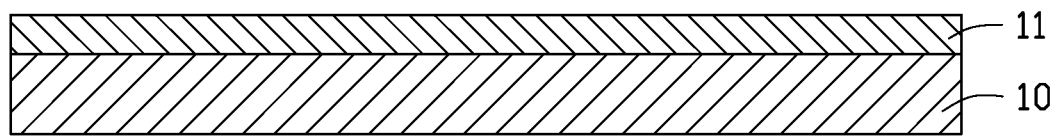
FIG. 2 is a cross-sectional view showing S1 step in manufacturing the redistribution circuit structure.

Step S1 is shown in FIG. 2. The substrate 10 is made of a material conventionally used in the art, and the material may be an organic material such as glass or plastic. The substrate 10 may be flexible; and the substrate 10 is made of a plastic or a polymer. The peelable layer 11 can be various materials conventionally used in the art that can be peeled from the substrate 10 under light radiation such as laser radiation or ultraviolet light radiation. For example, in the present embodiment, the peelable layer 11 is made of polyimide that can be peeled from the substrate 10 under laser irradiation. In this way, after the redistribution layer is formed on the peelable layer 11 in a subsequent step, the redistribution layer can be peeled from the substrate 10, and the substrate 10 can be reused.

Figure 3:
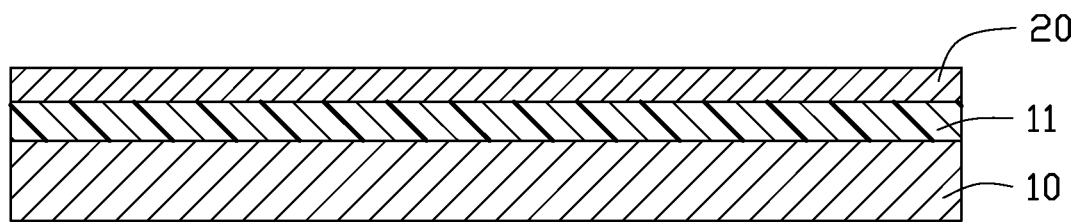
FIG. 3 is a cross-sectional view showing S2 step in manufacturing the redistribution circuit structure.
Figure 4A:
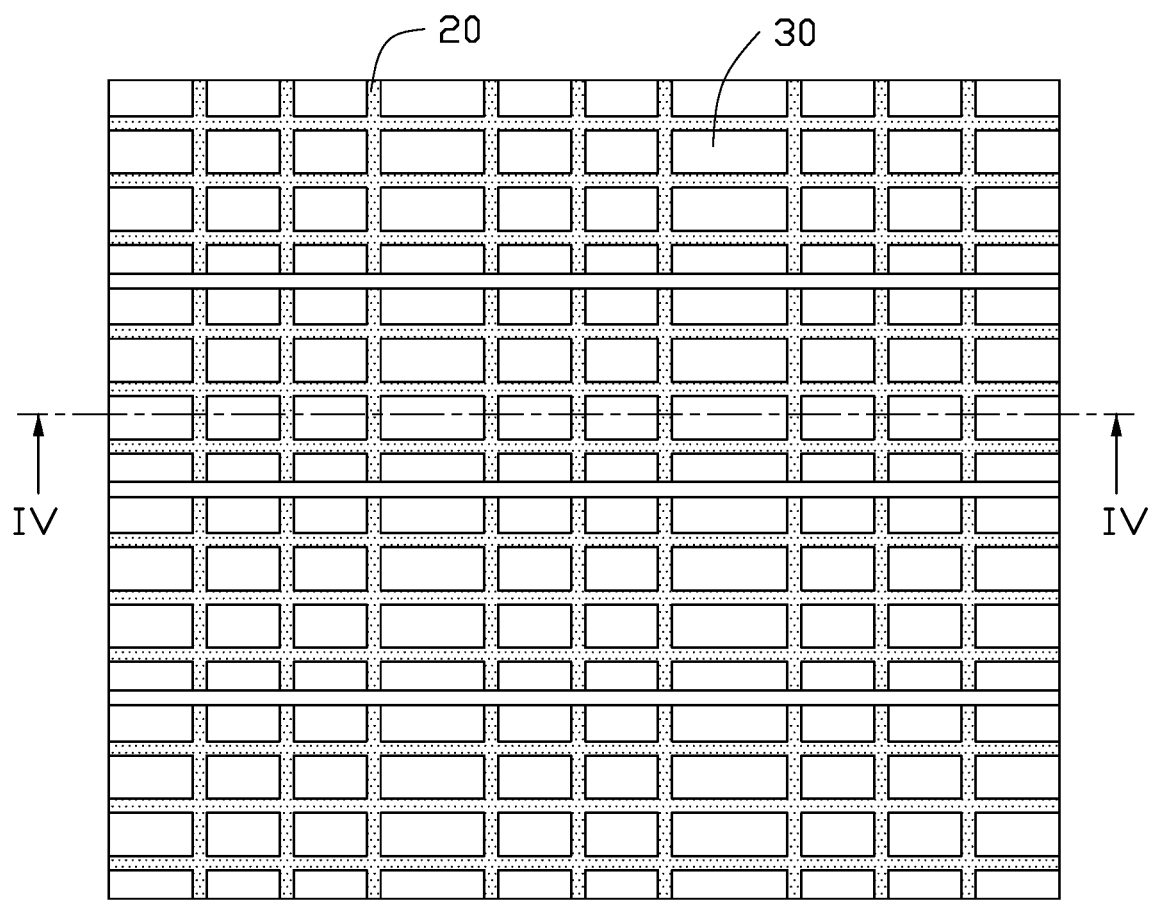
FIG. 4A and FIG. 4B are cross-sectional views showing S3 step in manufacturing the redistribution circuit structure.

Step S2 is shown in FIG. 3. FIG. 3 shows that the metal layer 20 is located on the peelable layer 11. The metal layer 20 may be a patterned metal layer that partially covers the surface of the peelable layer 11 away from the substrate 10. The metal layer 20 is provided in order to be able to perform several electroplatings in different sections on the substrate 10 in subsequent steps. The metal layer 20 may form a predetermined controlling circuit as shown in FIG. 4A. The controlling circuit include at least two units spaced apart and disconnected from each other. In the electroplating process (see later), a plating electrode (not shown) is electrically coupled to a portion of the metal layer 20 and enables the portion of the metal layer 20 to be electroplated, while other portion of the metal layer 20 cannot be electroplated. The metal layer 20 may be made of various conductive metals conventionally used in the art, such as copper and copper alloys. The controlling circuit formed by the metal layer 20 is not limited to being the intersecting grid of conductive lines shown in FIG. 4A, but may be other various circuits. The circuit pattern may be regular or irregular, as long as the plating can be done on the sections more than once on the substrate 10.

Figure 4B:
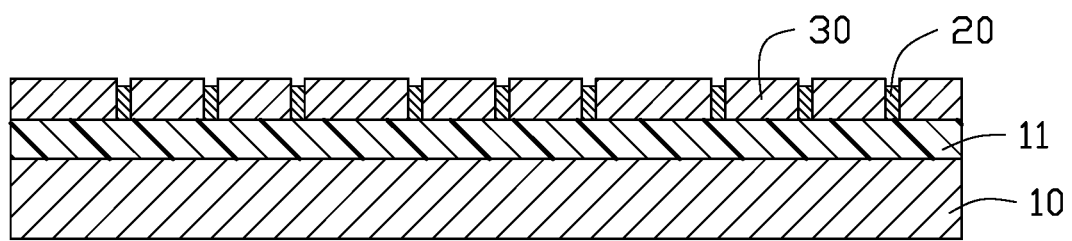

Step S3 is shown in FIG. 4B. The first photoresist layer 30 is formed on the surface of the peelable layer 11 having the metal layer 20. The first photoresist layer 30 and the metal layer 20 cover different areas of the peelable layer 11 and do not overlap with each other in a thickness direction. The metal layer 20 exposed from the first photoresist layer 30 is a controlling circuit, and the controlling circuit may include a conductive circuit and a connection circuit to control sub-section plating. Step S3 may specifically include: forming a photoresist layer (not shown) on the surface of the peelable layer 11 having the metal layer 20, to completely cover the substrate 10, exposing and developing the photoresist layer, and removing a portion of the photoresist layer. The remaining portion of the photoresist layer is formed as the first photoresist layer 30. In this embodiment, a thickness of the first photoresist layer 30 is slightly more than a thickness of the metal layer 20.

For steps S2-S3, a current density and a current uniformity of the controlling circuit in each square unit of each section are substantially the same. These need to be the same or have only slight difference when designing and applying the controlling circuit, since the current density and the current uniformity of each section will affect the thickness of the subsequent plating film, the film uniformity, and the plating time.

Figure 5:
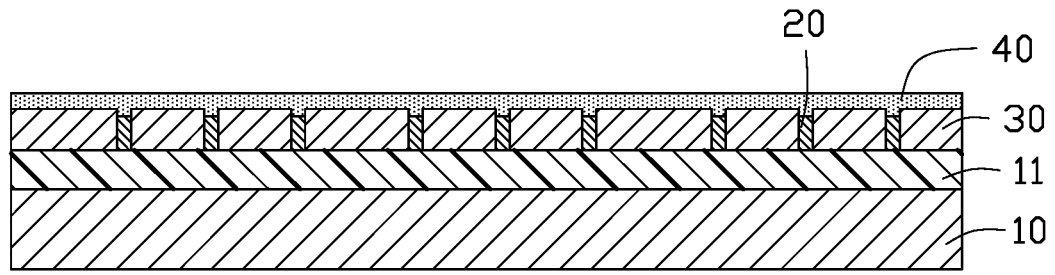
FIG. 5 is a cross-sectional view showing S4 step in manufacturing the redistribution circuit structure.

Step S4 is shown in FIG. 5. The insulating layer 40 completely covers a side of the metal layer 20 and the first photoresist layer 30 away from the substrate 10.

Figure 6:
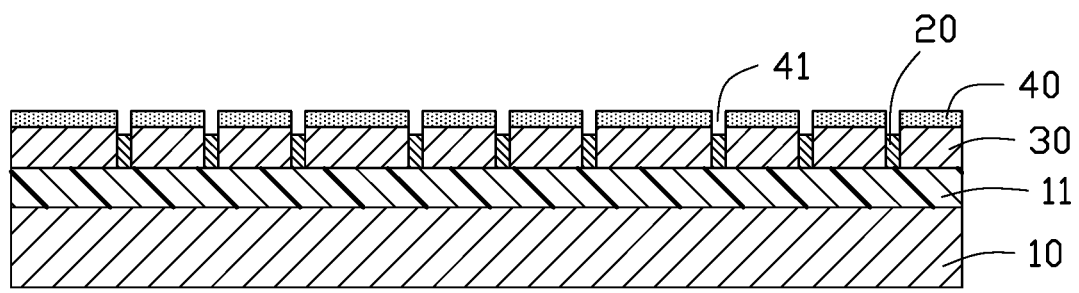
FIG. 6 is a cross-sectional view showing S5 step in manufacturing the redistribution circuit structure.

Step S5 is shown in FIG. 6. The through holes 41 are defined in the insulating layer 40 to expose the metal layer 20, exposing the positions where the plating electrode (not shown) contacts the metal layer 20 in subsequent electroplating processes, to ensure that electroplating can be performed. According to different requirements, positions and sizes of the through holes 41 can be adjusted. The diameters of the through holes 41 in different sections can be different to adjust the current density in the section during electroplating (the current density is related to the current intensity and the cross-sectional area of the conductive layer). In this embodiment, each of the through holes 41 is aligned to an intersection of the conductive lines of the metal layer 20 shown in FIG. 4A.

Figure 7:
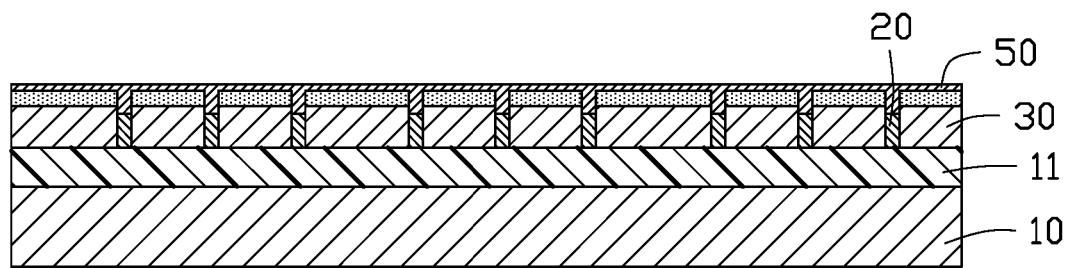
FIG. 7 is a cross-sectional view showing S6 step in manufacturing the redistribution circuit structure.

Step S6 is shown in FIG. 7. The seed layer 50 may be a conductive layer formed by various methods conventionally used in the art, for example, chemical vapor deposition and physical vapor deposition, and physical vapor deposition such as sputtering. The seed layer 50 is thinner than a plating layer to be formed later. FIG. 7 shows the seed layer 50 as a momentary element. Actually, the seed layer 50 is patterned and is formed as an initial metal redistribution layer having a pattern consistent with a required redistribution layer.

Figure 8A:
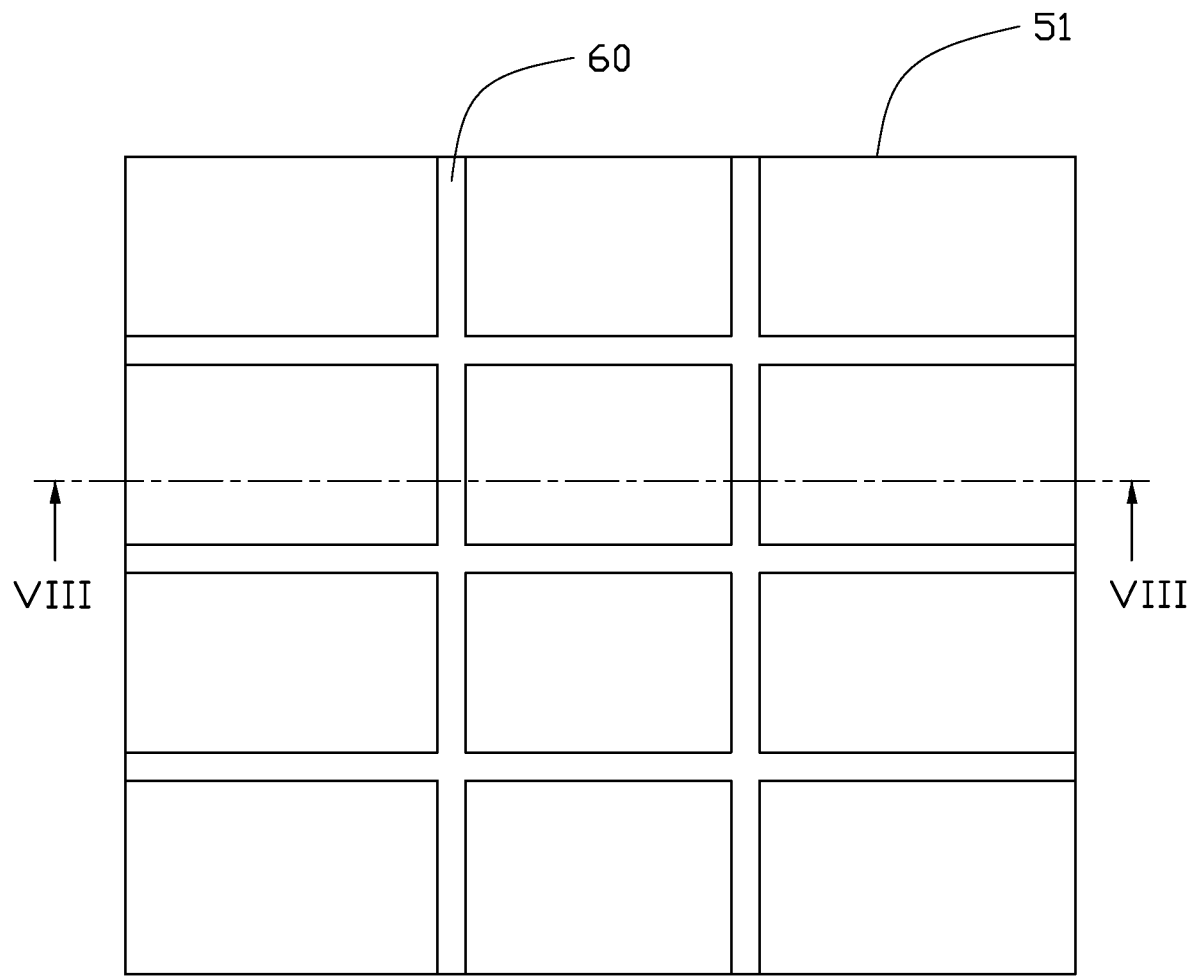
FIG. 8A and FIG. 8B is a cross-sectional view showing S7 step in manufacturing the redistribution circuit structure.
Figure 8B:
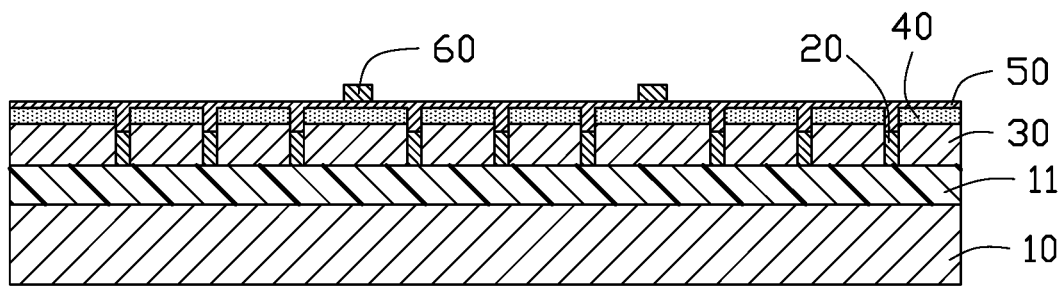

Step S7 is shown in both FIG. 8A and FIG. 8B. In the present embodiment, the block layer 60 is formed on the seed layer 50 and divides the seed layer 50 into a plurality of sections 51 arranged in an array, as shown in FIG. 8A. FIG. 8A shows twelve sections 51. The block layer 60 is electrically insulating. A subsequent redistribution layer will be formed in each section 51. The redistribution layer includes a seed layer 50 and a plating layer 70 for later electroplating on the seed layer 50. The redistribution layer in each section 51 is not limited to just one, to correspond with one integrated circuit (IC) unit, multiple redistribution layers corresponding to multiple IC units may be applied.

Figure 9:
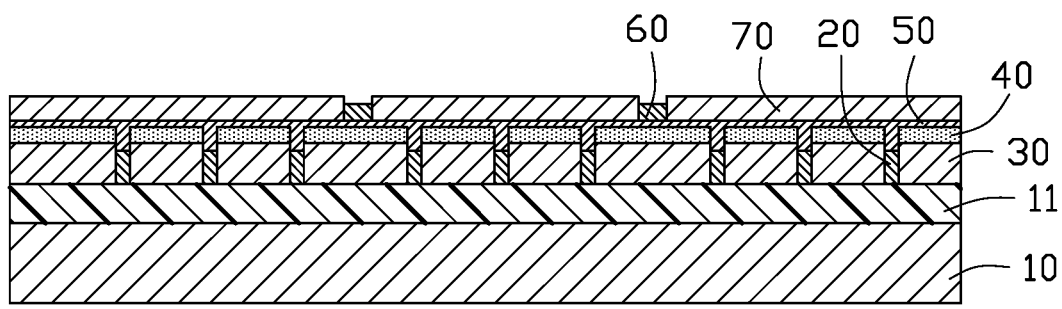
FIG. 9 is a cross-sectional view showing S8 step in manufacturing the redistribution circuit structure.

Step S8 is shown in FIG. 9. Each time at least one unit of the controlling circuit is powered on to carry out electroplating in at least one section. The plating layer 70 is laminated on the seed layer 50 and correspondingly formed as a metal redistribution layer. It can be understood that that the number of sections 51 to be electroplated each time can be adjusted and designed according to requirements. For example, in one embodiment, three sections 51 in a first horizontal row as shown in FIG. 8A may be electroplated the first time; at this time, the portion of the metal layer 20 corresponding to the three sections 51 needs to be energized so electroplating can be performed, other portions of the metal layer 20 corresponding to other sections 51 not being energized. After the first electroplating, three sections 51 in a second horizontal row as shown in FIG. 8A may be electroplated as a second process; three sections 51 in a third horizontal row as shown in FIG. 8A may be electroplated as a third process; and three sections 51 in a fourth horizontal row as shown in FIG. 8A may be electroplated as a fourth process. The plating arrangement and sequence of the sections 51 can be adjusted and designed as required. In other embodiments, only one section 51 is electroplated at one time.

When an electroplating layer having a large size of area is formed at one time, the electroplating layer may have an uneven thickness. For example, the electroplating layer can be thick in a middle portion and relatively thin in an edge portion. In this embodiment, the electroplating is divided into several sections. At least one section 51 is electroplated, and all sections are completed after multiple electroplatings. In this way, a uniformity of the plating layer in each section 51 is improved, so that all the layers when finally electroplated have a better uniformity of thickness.

The method for making a redistribution circuit structure may further include step S9 and step S10, not shown in FIG. 1.

Step S9: the block layer 60 and parts of other layers covered by the block layer 60 and below the block layer 60 are removed until the peelable layer 11 is exposed.

Step S10: a second photoresist layer 80 is formed between the independent sections 51, and the second photoresist layer 80 fills a space between adjacent sections 51.

Figure 10:
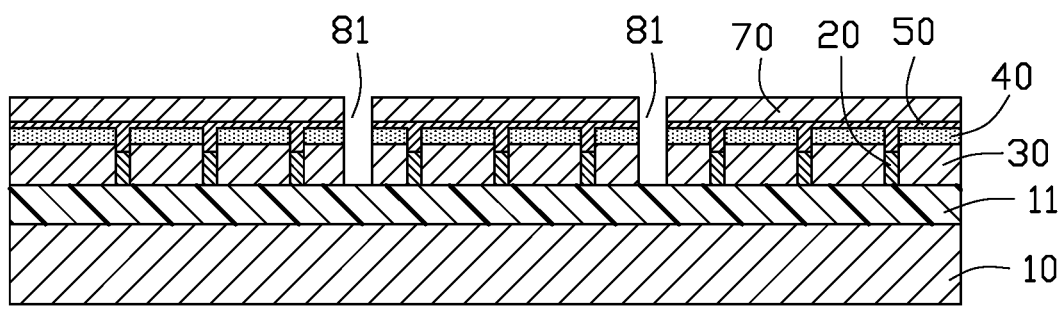
FIG. 10 is a cross-sectional view showing S9 step in manufacturing the redistribution circuit structure.
Figure 11:
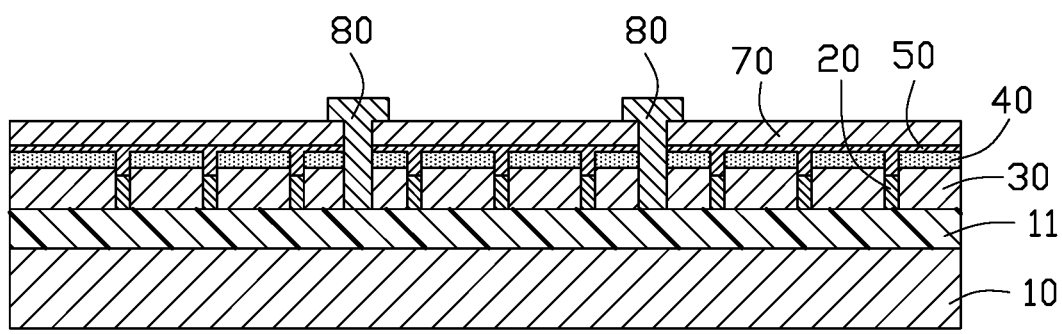
FIG. 11 is a cross-sectional view showing S10 step in manufacturing the redistribution circuit structure.

Step S9 is shown in FIG. 10. As shown in FIG. 10, a trench 81 is defined to extend through the insulating layer 40 and the first photoresist layer 30, so as to obtain a plurality of sections 51 independent from each other. Step S10 is shown in FIG. 11.

The method further includes a step of forming another plating layer (not shown) on the plating layer 70 with reference to the above steps.

The method further includes a step of peeling the peelable layer 11 away from the substrate 10 by irradiating laser or ultraviolet light after the electroplating is completed.

As mentioned above, since each section 51 may include multiple redistribution layers corresponding to multiple IC units, the method further includes a step of dividing the redistribution layers in each section 51.

The method disclosed for making the redistribution circuit structure improves uniformity of thickness of the plating layer by forming a plating layer on the substrate in segments.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for making a redistribution circuit structure, comprising:

providing a substrate and forming a peelable layer on a surface of the substrate;

forming a metal layer on a surface of the peelable layer away from the substrate, the metal layer partially covering the surface, the metal layer comprising a controlling circuit comprising at least two units spaced apart from each other;

forming a first photoresist layer on a portion of the surface of the peelable layer that is not covered by the metal layer;

forming an insulating layer to cover the first photoresist layer and the controlling circuit;

defining a plurality of through holes in the insulating layer to partially expose the controlling circuit;

forming a seed layer on a side of the insulating layer away from the substrate, the seed layer being conductive and patterned;

forming a block layer on the seed layer to divide the seed layer into a plurality of sections independent from each other, the block layer being electrically insulative; and electroplating on a portion of the seed layer in at least one of the plurality of sections by powering on at least one unit of the controlling circuit to form a plating layer, and performing at least two times of electroplating until all the sections have been electroplated.

2. The method of claim 1, wherein providing the substrate comprises providing a flexible substrate.

3. The method of claim 1, wherein powering on at least one unit of the controlling circuit is carried out by a portion of the plurality of through holes.

4. The method of claim 1, wherein forming the seed layer comprises forming the seed layer as an initial metal redistribution layer having a pattern consistent with a required redistribution layer.

5. The method of claim 4, wherein the seed layer and the plating layer in each of the plurality of sections form at least one redistribution layer.

6. The method of claim 5, wherein there are a plurality of redistribution layers in each of the plurality of sections.

7. The method of claim 1, wherein the method further comprises removing the block layer and parts of other layers covered by the block layer and below the block layer to expose the peelable layer.

8. The method of claim 7, wherein the method further comprises forming a second photoresist layer between adjacent sections, the second photoresist layer fills a space between adjacent sections.

9. The method of claim 1, wherein forming the peelable layer comprises forming the peelable layer made of a material that is peeled from the substrate under light radiating.

10. The method of claim 9, wherein the peelable layer is made of polyimide.

11. The method of claim 1, wherein the plurality of sections is arranged in an array.

* * * * *